(12) United States Patent
Kim et al.

(10) Patent No.: US 7,311,109 B2
(45) Date of Patent: Dec. 25, 2007

(54) METHOD FOR CLEANING A PROCESSING CHAMBER AND METHOD FOR MANUFACTURING A SEMICONDUCTOR DEVICE

(75) Inventors: Jung-wook Kim, Osan-si (KR); Hyeon-Deok Lee, Seoul (KR); Jin-Gi Hong, Suwon-si (KR); Ji-Soon Park, Suwon-si (KR); Eung-Joon Lee, Suwon-si (KR)

(73) Assignee: Samsung Electronics Co., Ltd., Suwon, Kyungki-Do (KR)

( * ) Notice: Subject to any disclaimer, the term of this patent is extended or adjusted under 35 U.S.C. 154(b) by 480 days.

(21) Appl. No.: 10/606,512

(22) Filed: Jun. 26, 2003

(65) Prior Publication Data

US 2004/0074515 A1   Apr. 22, 2004

(30) Foreign Application Priority Data

Oct. 22, 2002   (KR) ............. 10-2002-0064554

(51) Int. Cl.
*B08B 9/00* (2006.01)
*H01L 21/00* (2006.01)

(52) U.S. Cl. .............. 134/1.2; 134/22.1; 134/26; 216/67; 216/74; 438/905

(58) Field of Classification Search ........... 134/1, 134/1.3, 26, 30, 1.2, 22.1; 216/67, 74; 438/905, 438/906
See application file for complete search history.

(56) References Cited

U.S. PATENT DOCUMENTS

| | | | | |
|---|---|---|---|---|
| 4,786,352 A | * | 11/1988 | Benzing | 156/345.48 |
| 5,462,896 A | * | 10/1995 | Komura et al. | 438/268 |
| 5,626,775 A | * | 5/1997 | Roberts et al. | 216/67 |
| 5,647,953 A | * | 7/1997 | Williams et al. | 134/1.1 |
| 5,660,682 A | * | 8/1997 | Zhao et al. | 438/715 |
| 6,174,796 B1 | * | 1/2001 | Takagi et al. | 438/622 |
| 6,649,082 B2 | * | 11/2003 | Hayasaka et al. | 252/79.1 |
| 6,861,356 B2 | * | 3/2005 | Matsuse et al. | 438/653 |
| 6,992,011 B2 | * | 1/2006 | Nemoto et al. | 438/706 |

* cited by examiner

*Primary Examiner*—Michael Barr
*Assistant Examiner*—Saeed Chaudhry
(74) *Attorney, Agent, or Firm*—F. Chau & Associates, LLC.

(57) ABSTRACT

A method for cleaning a processing chamber and manufacturing a semiconductor device by removing impurities from a substrate in the processing chamber with a plasma of a first gas including hydrogen gas. After the substrate is removed from the processing chamber, the processing chamber is etched with the plasma of a non-hydrogenous second gas. Thus, the etching selectivity can be improved and the particles are prevented from depositing and/or forming on the substrate.

16 Claims, 11 Drawing Sheets

METHOD FOR CLEANING A PROCESSING CHAMBER AND METHOD FOR MANUFACTURING A SEMICONDUCTOR DEVICE

BACKGROUND OF THE INVENTION

1. Technical Field of the Invention

The present invention relates, generally, to a method for cleaning a processing chamber used for manufacturing a semiconductor device and a method for manufacturing the semiconductor device by employing the same. More particularly, the present invention relates to a method for cleaning a processing chamber by removing impurities on a semiconductor substrate and in the processing chamber before employing a chemical vapor deposition process, and a method for manufacturing a semiconductor device by employing the same.

2. Discussion of the Related Art

As semiconductor devices become more highly integrated, the design rules, for example the channel lengths of transistors, the intervals of active regions, the widths of wirings, the intervals of wirings, and the sizes of contact holes, have been reduced. Therefore, the aspect ratio of a contact hole formed on a semiconductor substrate has gradually increased. The aspect ratio of the contact hole indicates a ratio of a depth of the contact hole relative to the diameter of the contact hole.

In the conventional interconnecting wires and films using aluminum (Al) deposited by a sputtering process, there are several disadvantages. For example, the contact resistance of the wiring or the connecting film may increase in accordance with the high degree of integration of a semiconductor device while the step coverage of a deposited film may deteriorate. Thus, the wiring and the connecting films may be more easily broken at the windows of the contact holes. Also, the connecting film using aluminum (Al) may also be more easily broken due to electro-migration during operation of a semiconductor device.

Considering the above-mentioned problems, there are various metal plugs for electrically connecting a conductive layer to an underlying conductive layer. In this case, a contact hole is formed through an interlayer dielectric film interposed between an upper and a lower conductive layers, and then a metal plug fills the contact hole to electrically connect the upper conductive layer to the lower conductive layer.

Generally, a metal plug including tungsten (W) has good step coverage, and is formed using a plasma enhanced chemical vapor deposition (PECVD) process.

Figure 1:
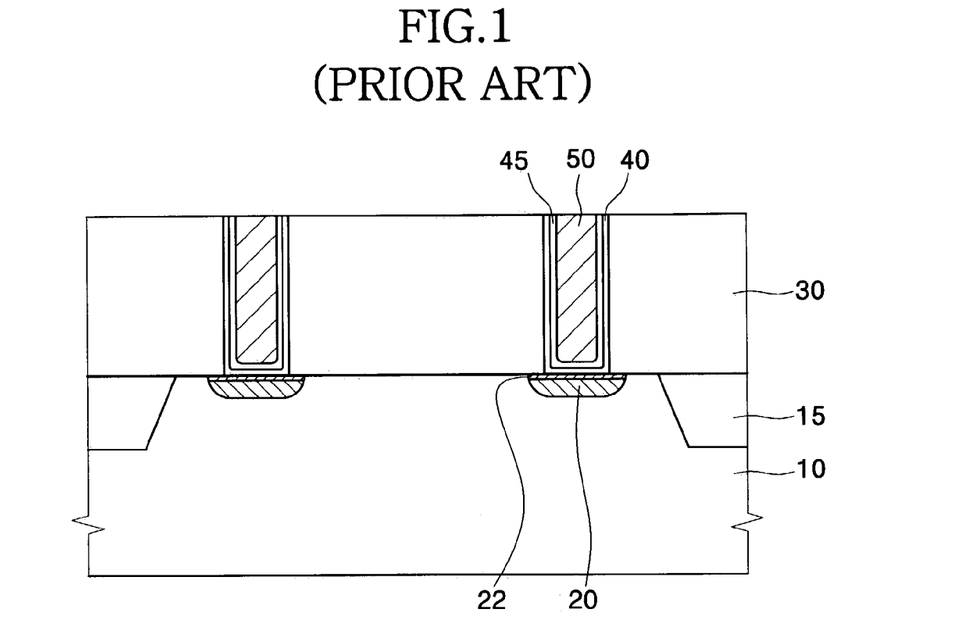
FIG. 1 is a cross-sectional view illustrating a conventional semiconductor device including contact holes.

FIG. 1 is a cross-sectional view illustrating a semiconductor device including contact holes. In FIG. 1, metal plugs are formed in contact holes by a deposition process after the contact holes are formed through an interlayer dielectric film 30.

Referring to FIG. 1, an active region and a field region 15 are defined in a semiconductor substrate 10, and then the interlayer dielectric film 30 is formed on the substrate 10.

Source/drain region 20 having predetermined patterns is formed in the substrate 10 beneath the interlayer dielectric film 30. The source/drain region 20 is formed by using an ion implantation process in which dopant atoms are implanted into the substrate 10.

A metal silicide film 22 is formed on the semiconductor substrate 10 to improve the electric conductivity between the source/drain region 20 and a metal plug 50. A contact hole is formed through the interlayer dielectric film 30 by an etching process to expose the metal silicide film 22.

Then, titanium (Ti) 40 and titanium nitride (TiN) 45 films are deposited on the interlayer dielectric film 30 including the contact hole. The titanium film 40 and the titanium nitride film 45 serve together as a barrier layer. The titanium film 40 is formed in the contact hole and on the interlayer dielectric film 30 by a chemical vapor deposition (CVD) process or a sputtering process, and the titanium nitride film 45 is formed on the titanium film 40 by a CVD process or a sputtering process. In addition, to form the metal plug 50, tungsten is deposited in the contact hole and on the titanium nitride film 45.

Further, the metal silicide layer 22 is formed on the source/drain region 20 to reduce the contact resistance between the metal plug 50 and the source/drain region 20. That is, the metal suicide layer 22 serves as an ohmic layer to reduce the contact resistance between the source/drain region 20 and the metal plug 50. Also, the metal silicide layer 22 works as a diffusion barrier layer that can prevent materials from mutually diffusing between a metal layer and a semiconductor substrate or between two metal layers of a multi-layered construction.

The metal silicide layer 22 generally includes metal silicide such as titanium silicide ($TiSi_2$), platinum silicide ($PtSi_2$), palladium suicide ($PdSi_2$), cobalt silicide ($CoSi_2$), or nickel silicide ($NiSi_2$). Because the cobalt silicide is stable at the high temperature of about 900° C., a doped glassy film for planarization can be sufficiently formed on the cobalt silicide. Additionally, because the cobalt silicide has a low resistance of about 16 to about 18 $\mu\Omega\cdot cm$, the suicide cannot be extended on the semiconductor substrate along the horizontal and the vertical directions. Furthermore, the cobalt silicide can be selectively etched, but not excessively etched during a plasma etching process in comparison with the titanium silicide.

However, a native oxide film may be easily formed on a cobalt silicide as compared to a titanium silicide such that the oxide film creates a barrier between the cobalt silicide and metal formed thereon. In other words, the cobalt silicide may have poor electrical contact relative to the metal formed thereon due to the oxide film. Thus, the surface of the cobalt silicide layer should be cleaned by a cleaning process.

Figure 2:
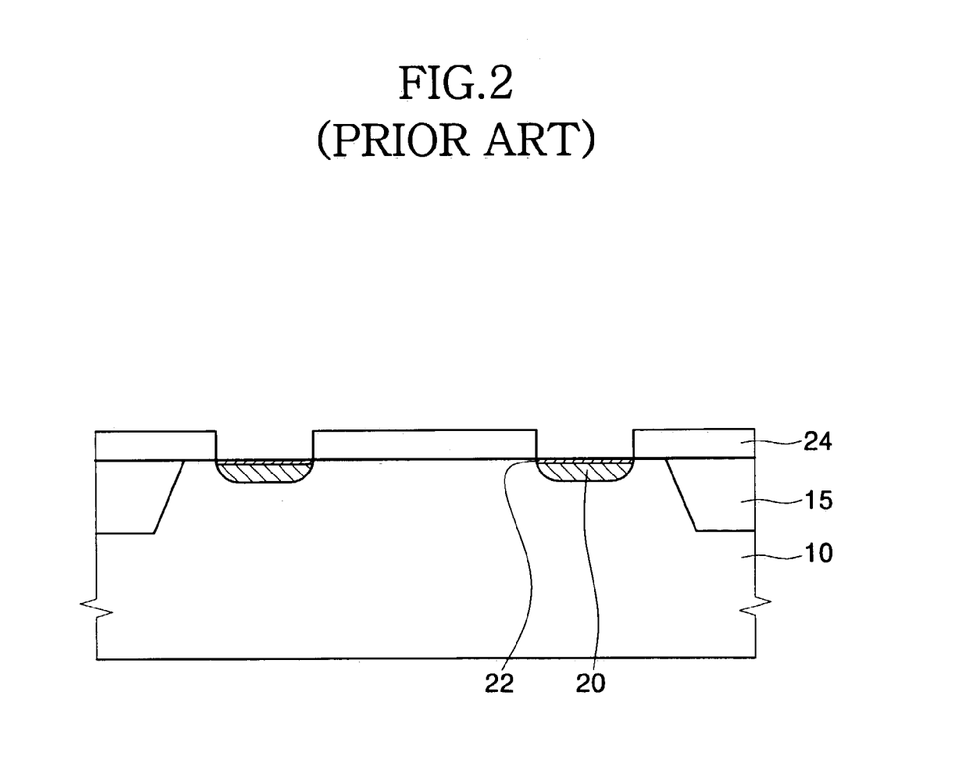
FIGS. 2 and 3 are cross-sectional views illustrating a conventional process for forming a tungsten plug.
Figure 3:
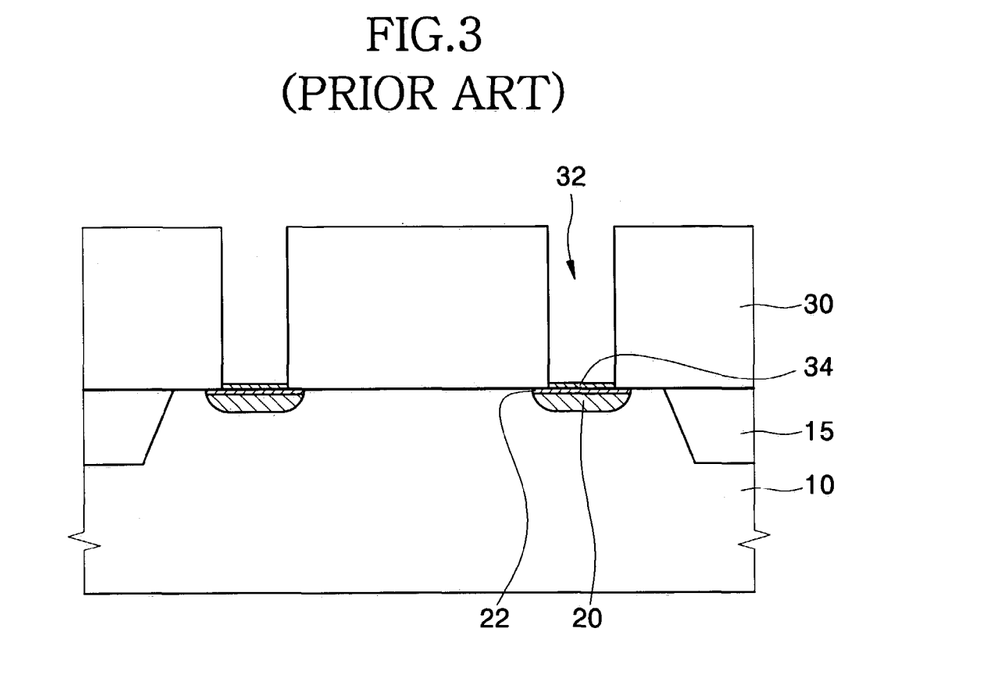

FIGS. 2 and 3 are sectional views illustrating the conventional method for forming a tungsten plug.

Referring to FIG. 2, after a passivation layer 24 including a photoresist or an oxide is formed on a semiconductor substrate 10, the passivation layer 24 is partially etched in accordance with a predetermined pattern, thereby exposing predetermined region of the substrate 10, for example, a source/drain region.

Dopant atoms are implanted into the exposed region of the substrate 10 such that the source/drain region are formed on the substrate 10. The metal for forming a metal silicide film 22 is then deposited on the source/drain region by a chemical vapor deposition (CVD) process or a sputtering process. The metal reacts with silicon at a high temperature so that the metal silicide film 22 is formed on the source/drain region. Preferably, titanium (Ti) or cobalt (Co) may be employed to form the metal silicide film 22. The titanium or cobalt reacts with the silicon of the substrate 10 to form a titanium silicide ($TiSi_2$) film or a cobalt silicide ($CoSi_2$) film.

Referring to FIG. 3, after the remaining passivation layer 24 is removed, an interlayer dielectric film 30 is formed on the semiconductor substrate 10 including the metal silicide film 22 formed thereon.

A photoresist pattern for forming a contact hole 32 is formed on the interlayer dielectric film 30 by a photolithography process, and then the source/drain region is exposed through an etching process, thereby forming the contact hole 32. In this case, an oxide film 34 may be formed on the metal silicide film 22 exposed through the contact hole 32 after the etching process for forming the contact hole 32 is performed. In addition, impurities including etched by-products may exist on the metal silicide film 22. Because the semiconductor substrate 10 generally goes through several manufacturing processes to complete a semiconductor device, the semiconductor substrate 10 may come into contact with the surrounding atmosphere when the semiconductor substrate 10 is transferred from one processing chamber to another processing chamber. At that time, the oxide film 34 may be formed on the substrate 10 when the substrate 10 comes into contact with the surrounding atmosphere. Though a minute oxide film 34 is interposed between the source/drain region 20 and the metal plug 50, the electrical contact between the source/drain region 20 and the metal plug 50 is poor.

Accordingly, the oxide film 34 and the remaining impurities in the contact hole 32 should be removed from the substrate 10 before depositing other films for forming the plug 50 in the contact hole 32. The process for removing the oxide film 34 and remaining impurities is called a pre-cleaning process.

The pre-cleaning process has been provided to remove oxide films and other impurities from the substrate before employing a CVD process for depositing titanium and titanium nitride films. For example, in Unity-EP (manufactured by Tokyo Electoron Co. in Japan) for depositing a titanium/titanium nitride film employing a CVD process, the titanium/titanium nitride film is deposited after the pre-cleaning process is executed. When the metal silicide film includes cobalt silicide, the substrate is generally pre-cleaned with a discrete apparatus by employing a radio frequency (RF) plasma etching process ex-situ, and then the pre-cleaned substrate is transferred to a processing chamber for performing a CVD process.

In addition, the Unity-EP may have an additional function by installing a adequate processing module. Also, the Unity-EP can perform the pre-cleaning process in-situ by installing a Pre-Cleaning Etching Module (PCEM) therein. When the pre-cleaning is executed in-situ, the processing time can be reduced, and the throughput can be improved.

In the conventional pre-cleaning method, a plasma etching process is performed in a processing chamber with an argon (Ar) gas. However, when the pre-cleaning method is performed with the argon gas through a dry etching process, several disadvantages may occur as follows.

Figure 4:
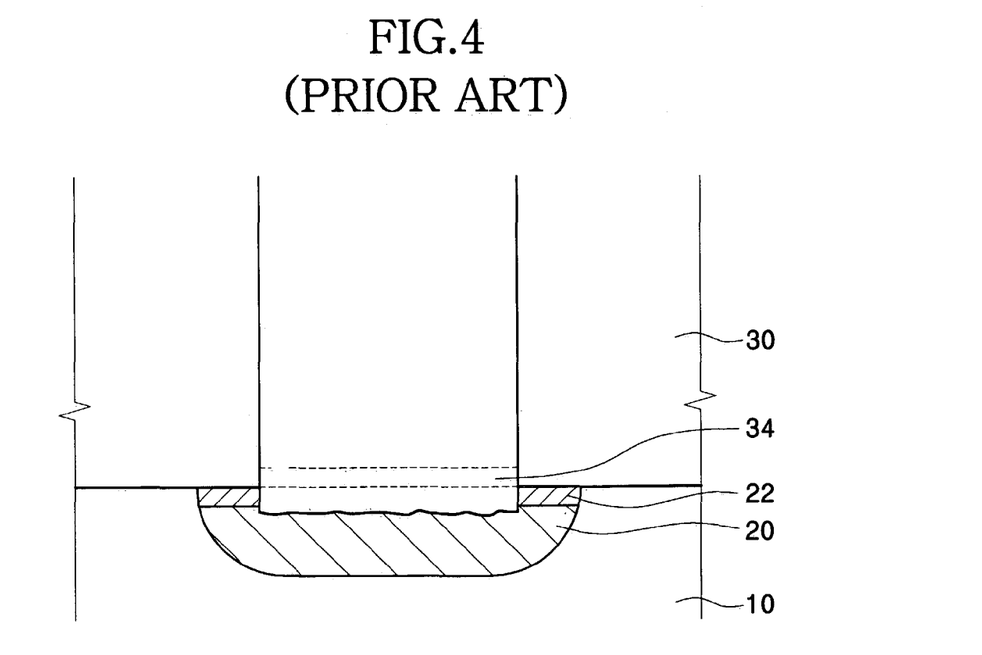
FIG. 4 is an enlarged cross-sectional view showing a source/drain region of FIG. 3.

FIG. 4 is an enlarged cross-sectional view showing the surface of the source/drain region in FIG. 3.

As shown in FIG. 4, the metal silicide film 22 is damaged when the RF plasma etching process is excessively performed with the argon gas. In other words, the conventional methods remove the metal suicide layer 22 with an oxide film and other impurities during the RF plasma etching process.

It is very difficult to precisely control the RF etching process without etching the metal silicide film 22. Also, the time may be disadvantageously increased when the etching process is executed by controlling the amount of the metal silicide film 22 to be etched. Furthermore, the manufacturing cost of a semiconductor device is increased while the yield of the semiconductor device is reduced. In fact, the cobalt silicide film is removed with the oxide film and the impurities at an identical rate as the oxide film and the impurities are removed from the substrate during the etching process. As a result, processing failures are caused due to the loss of the cobalt silicide film.

SUMMARY OF THE INVENTION

The present invention has been made to solve the aforementioned problems. According to an embodiment of the present invention, a method provides for cleaning a processing chamber, which can minimize the damage of a metal silicide film by improving the etching selectivity of an oxide film relative to the metal silicide film.

According to another embodiment of the present invention, a method for cleaning a processing chamber provides preventing the formation of particles in the processing chamber.

According to another embodiment of the present invention, a method for manufacturing a semiconductor device provides employing an improved process for cleaning a processing chamber, which can minimize the damage of a metal silicide film by improving the etching selectivity of an oxide film relative to the metal silicide film.

According to a preferred embodiment of the present invention, a method for cleaning a processing chamber provides that after impurities are removed from a semiconductor substrate in the processing chamber with a plasma of a first gas including a hydrogen gas, the semiconductor substrate is removed from the processing chamber. Then, the processing chamber is etched with a plasma of a non-hydrogenous second gas. In other words, the non-hydrogenous second gas does not include a hydrogen gas.

According to a preferred embodiment of the present invention, a method for cleaning a processing chamber provides a semiconductor substrate positioned on a stage in the processing chamber, and then the processing chamber is placed under vacuum. After a first gas is supplied into the processing chamber wherein the first gas includes an argon gas and a hydrogen gas, impurities on the semiconductor substrate are removed with a plasma generated from the first gas. Then, the first gas and other formed gases are exhausted from the processing chamber, and the semiconductor substrate is removed from the processing chamber. Subsequently, a vacuum is created in the processing chamber, and a non-hydrogenous second gas is supplied into the processing chamber. Then, the processing chamber is etched with a plasma of the second gas.

According to another preferred embodiment of the present invention, a method for manufacturing a semiconductor device provides that after a semiconductor substrate is positioned in a processing chamber, impurities are removed from the semiconductor substrate in the processing chamber with a plasma generated from a first gas including a hydrogen gas. The semiconductor substrate is removed from the processing chamber, and then the processing chamber is etched with a plasma of a non-hydrogenous second gas.

Preferably, the first gas includes an argon gas and a hydrogen gas. An oxide is selectively etched relative to a metal silicide film by performing the plasma etch with the first gas including hydrogen gas.

However, during the plasma etch generated from the hydrogen gas, some hydrogen molecules and other materials react to form atomic groups, e.g., radicals and the like. The radicals may easily react with a neighbor reactant such that at least one new chemical compound may be formed. Those radicals or chemical compounds having hydrogen may have an effect on the subsequently processed semiconductor substrates being treated in the processing chamber, and also the radicals and the compounds may cause particles to adhere to a substrate or deposit on a substrate subsequently processed in the chamber.

In other words, the excited radicals having hydrogen may react not only with cobalt (Co), silicon (Si) and silicon oxide ($SiO_2$) of the substrate but also with a quartz belljar disposed over the substrate and a quartz mask where the substrate is positioned. More particularly, the excited radicals may react with silicon oxide included in the quartz belljar and/or the quartz mask, and may remain in the processing chamber as a chemical compound. The remaining chemical compounds in the processing chamber may deposit on or adhere to other subsequently processed substrates, thereby forming particles on the substrates when the other substrates are treated in the processing chamber.

According to the present invention, after a first RF plasma etching process is performed with a first gas, the semiconductor substrate is removed from a processing chamber. Then, a second RF plasma etching process is executed with a second gas to remove hydrogen from the processing chamber. At that time, the second gas does not include hydrogen, and the second gas preferably includes an argon gas.

BRIEF DESCRIPTION OF THE DRAWINGS

The above and other features and advantages of the present disclosure will become more apparent by describing preferred embodiments thereof in detail with reference to the accompanying drawings in which.

DETAILED DESCRIPTION OF PREFERRED EMBODIMENTS

Hereinafter, the reaction mechanism of hydrogen ($H_2$) in a processing chamber will be described.

Reaction Mechanism of Hydrogen

In general, before titanium (Ti) and titanium nitride (TiN) films are deposited on a substrate, a pre-cleaning process is performed in-situ in an apparatus for a CVD process (for example, the Unity-EP) in which a PCEM is installed. When the pre-cleaning process is executed in-situ, the throughput of the process can be improved. Also, an undesired oxide film can be advantageously etched from the substrate by using a selective etch including argon (Ar) and hydrogen gases. A radio frequency plasma etching process is performed in the PCEM by employing an induced coupled plasma (ICP) corresponding to a high density plasma.

After a mixture of the argon and the hydrogen gases is introduced into the processing chamber, electric power is applied from an ICP device to excite the mixture. Then, bias power is applied to a stage on which a wafer is positioned, thereby starting the RF plasma etching.

The hydrogen gas introduced with the argon gas reacts with the oxide film on the substrate at the temperature of about 500° C. so that the oxide film is removed from the substrate as $H_2O$. In addition, the hydrogen gas reacts with cobalt included in a metal silicide layer on the substrate such that cobalt hydride ($CoH_x$) is deposited on the substrate.

The reactions among the oxide film, the hydrogen gas, and the cobalt suicide in the processing chamber proceed as the following equations:

$$Si + 4H^+ \rightarrow SiH_4 \uparrow \qquad \text{equation 1}$$

$$SiO_2 + 8H_2 \rightarrow SiH_4 \uparrow + 2H_2O \uparrow \qquad \text{equation 2}$$

$$Co + xH \rightarrow CoH_x \downarrow \qquad \text{equation 3}$$

According to the above-mentioned equations, the oxide film reacts with the hydrogen to form a hydrogenous compound like $SiH_4$ or water ($H_2O$), thereby removing the oxide film from the substrate as $SiH_4$ or $H_2O$. On the other hand, the metal silicide including the cobalt silicide is deposited on the substrate such that the metal silicide is not removed during the etching process. That is, the oxide film is selectively etched relative to the cobalt silicide. When the hydrogen gas is employed in the plasma etching process, the etching selectivity between the oxide film and the cobalt silicide film is nearly ten times augmented.

Hereinafter, the preferred embodiments of the present invention will be described in detail with reference to the accompanying drawings. In the following drawings, like reference numerals identify similar or identical elements.

Figure 5:
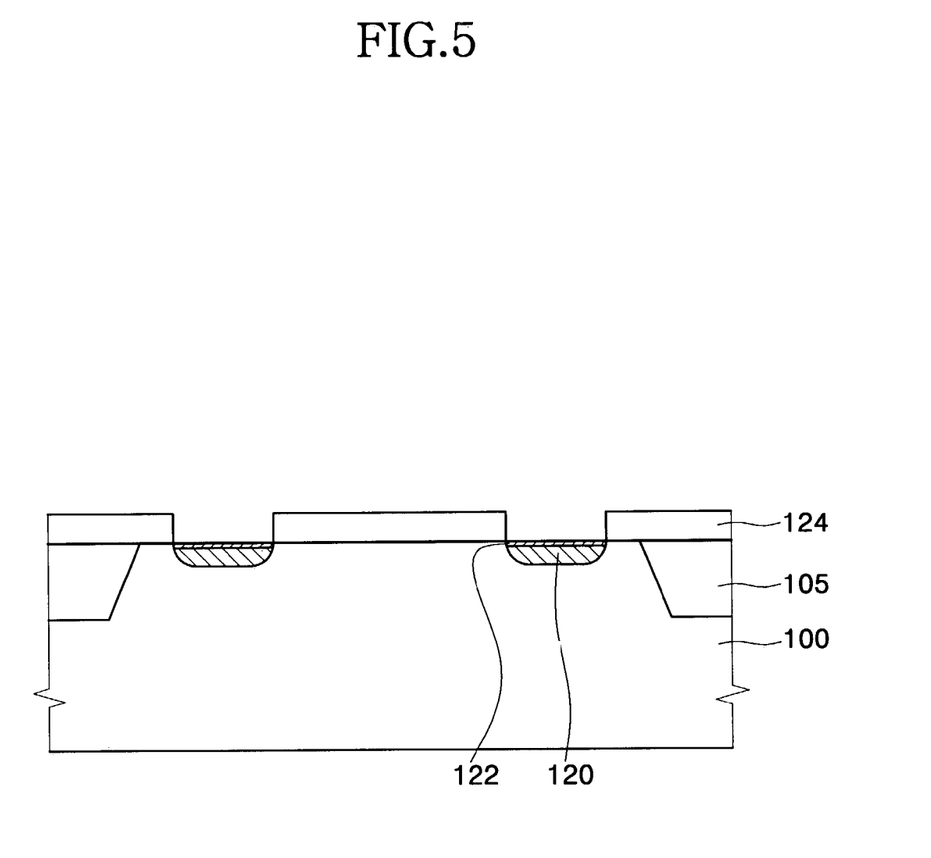
FIGS. 5 and 6 are cross-sectional views illustrating a method for forming a semiconductor device according to an embodiment of the present invention.
Figure 6:
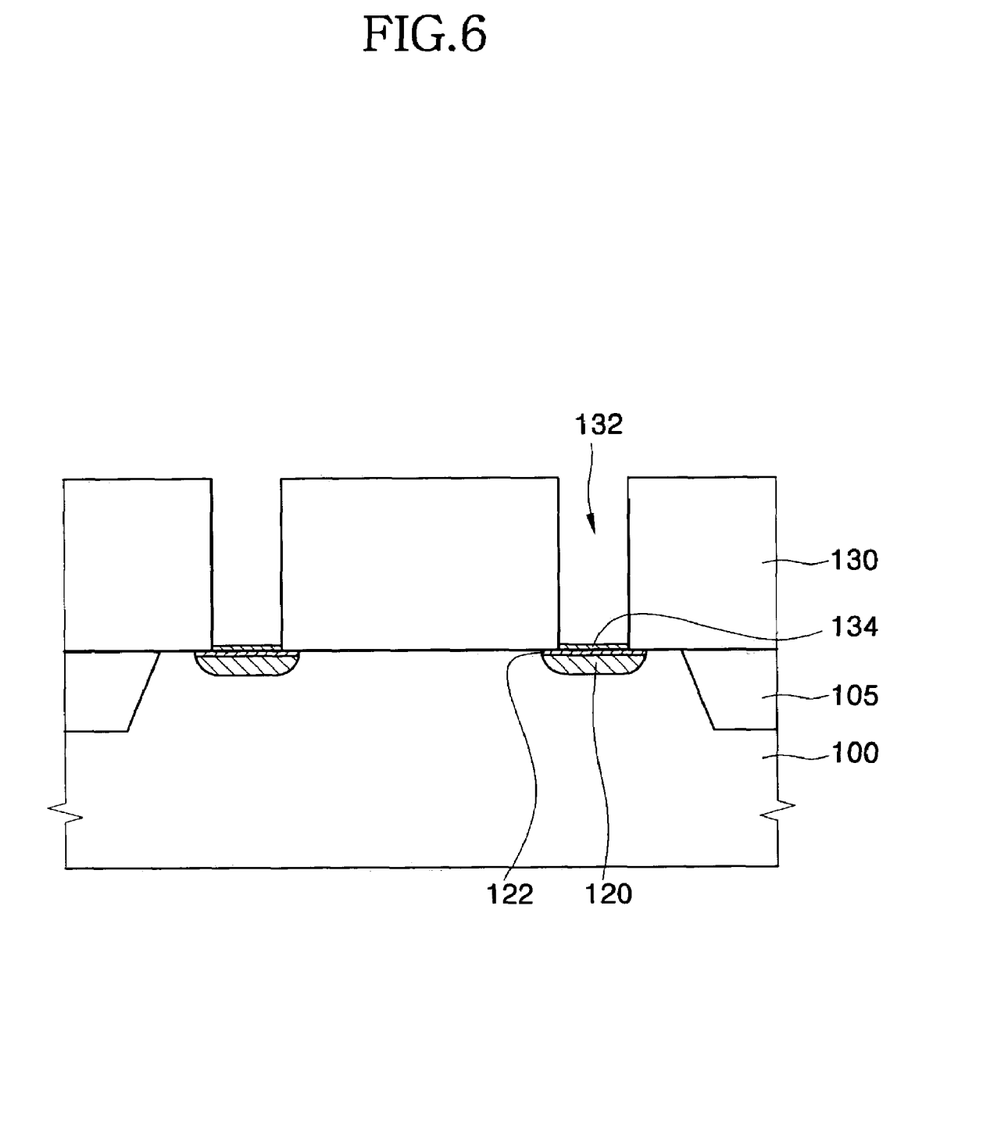

FIG. 5 and FIG. 6 are cross-sectional views illustrating a method for manufacturing a semiconductor device according to an embodiment of the present invention. FIGS. 5 and 6 show the formation of an oxide film removed through an etching process.

Referring to FIGS. 5 and 6, after a passivation layer 124 is formed on a semiconductor substrate 100 including an active region and a field region 105, the passivation layer 124 is patterned to expose the portion of the semiconductor substrate 100. Then, a source and drain region 120 is formed at the exposed portion of the substrate 100 by an ion implantation process.

Subsequently, a metal suicide film 122 is formed on the source and drain region 120 through a CVD process or a sputtering process. Because the process for forming the metal silicide film 122 is substantially performed at a high temperature, metal reacts with the silicon in the substrate 100 to form the metal silicide film 122 on the source and drain region 120. Preferably, a cobalt silicide ($CoSi_2$) film is formed on the source and drain region 120 using cobalt to minimize contact resistance. Other metals can be used to form the metal silicide film 122 on the source and drain region 120.

After the passivation layer 124 is removed, an interlayer dielectric film 130 is formed on the substrate 100 including the metal suicide film 122. Then, the interlayer dielectric film 130 is partially etched through a photolithography process to form a contact hole 132 exposing the source and drain region 120.

The substrate 100 comes into contacted with the surrounding atmosphere when the substrate 100 is transferred from one processing chamber to another processing chamber. At that time, an oxide film 134 is formed on the source and drain region 120 and on the inside of the contact hole 132 as shown in FIG. 6. In addition, after the photolithography process is performed for forming the contact hole 132, impurities like etched by-products remain on the source and drain region 120 and the inside of the contact hole 132.

Before a titanium (Ti) film and a titanium nitride (TiN) film are deposited on the inside of the contact hole 132, the oxide film 134 and the impurities should be removed from the surfaces of the source and drain region 120 and the contact holes 132. A pre-cleaning process is executed to remove the oxide film 134 and the impurities from the substrate 100 before successive processes.

Figure 7:
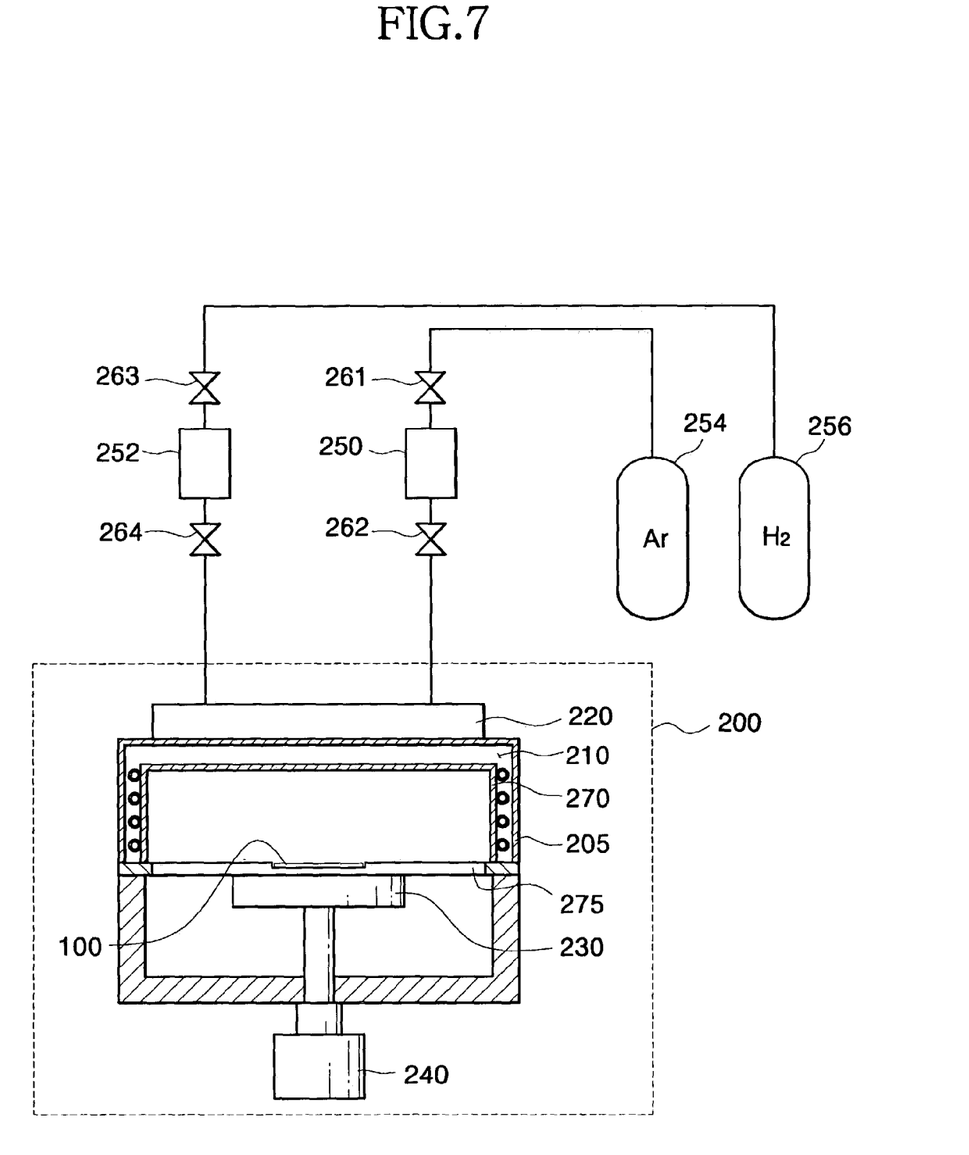
FIG. 7 is a schematic cross-sectional view illustrating an apparatus for pre-cleaning a substrate according to embodiments of the present invention.
Figure 8:
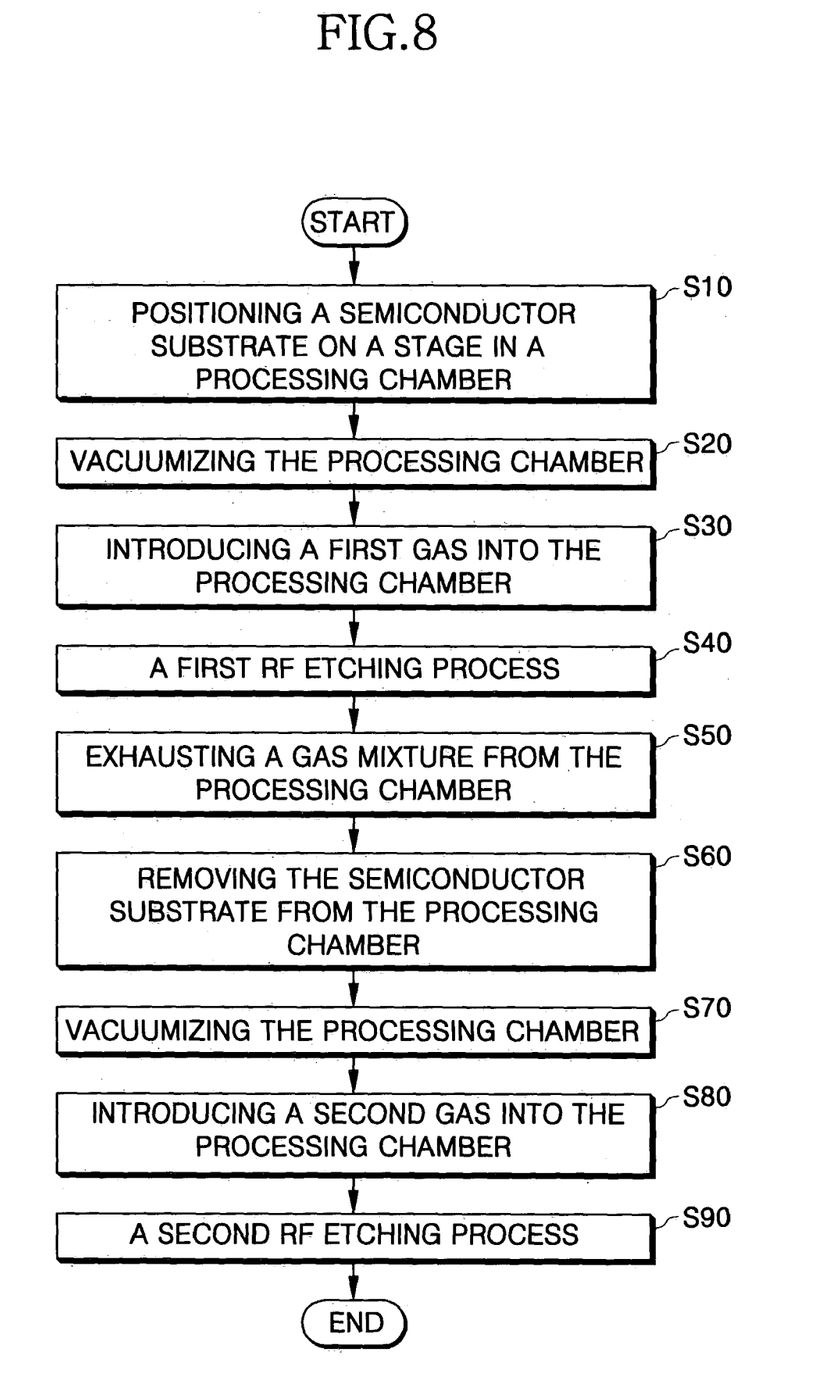
FIG. 8 is a flow chart illustrating a method for pre-cleaning the substrate according to an embodiment of the present invention.
Figure 9:
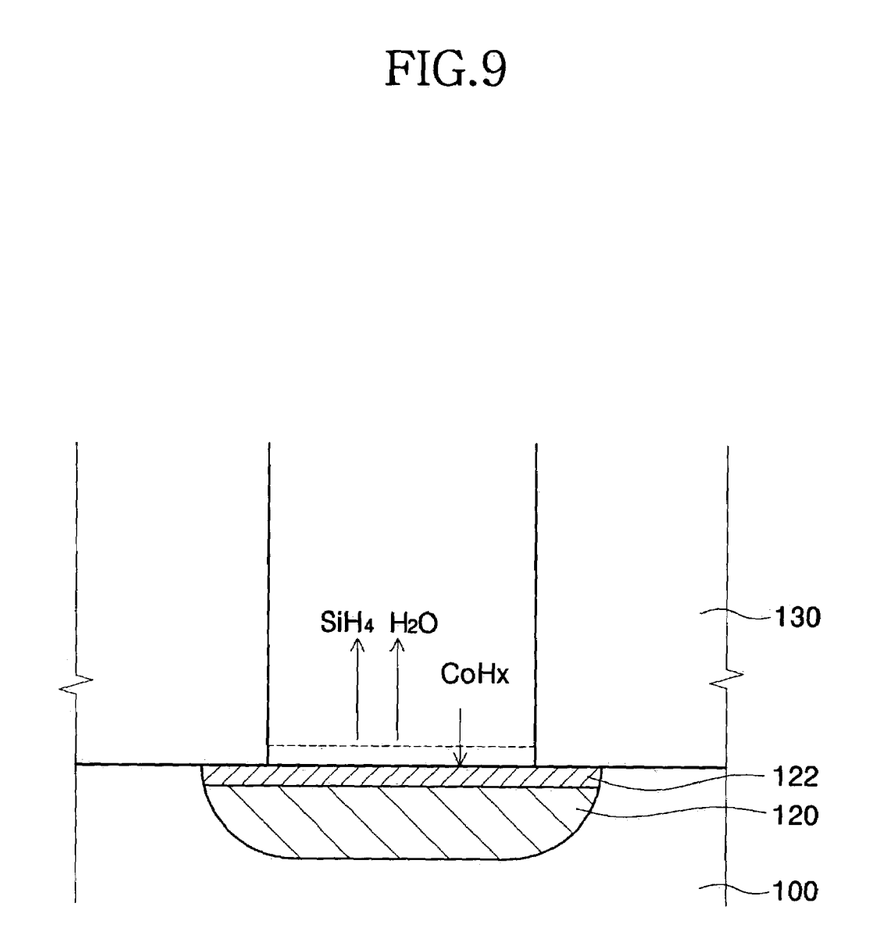
FIG. 9 is an enlarged cross-sectional view illustrating a RF etching method performed with respect to a contact hole in FIG. 6.

FIG. 7 is a schematic cross-sectional view illustrating an apparatus for pre-cleaning a substrate according to embodiments of the present invention, FIG. 8 is a flow chart illustrating the method for pre-cleaning the substrate according to the present invention, and FIG. 9 is an enlarged cross-sectional view illustrating a RF etching method performed with respect to a contact hole in FIG. 6.

Referring to FIG. 7, a pre-cleaning apparatus 200 of the present invention includes a housing 205 enclosing a processing chamber 210, an ICP device 220 disposed over a semiconductor substrate 100 for providing a plasma, a RF bias device 230 disposed under the substrate 100, a pump 240 for forming a vacuum in the processing chamber 210, a quartz mask 275 where the substrate 100 is positioned, and a quartz belljar 270 disposed over the quartz mask 275 for providing a processing space in the processing chamber 210.

The quartz mask 275 and the quartz belljar 270 provide the processing space in the processing chamber 210, and the substrate 100 is positioned on a stage provided by the quartz mask 275.

Also, supply tubes are connected to the pre-cleaning apparatus 200 to supply an argon gas and a hydrogen gas into the processing chamber 210. The supply tubes are connected to an argon supply source 254 and a hydrogen supply source 256. A first mass flow controller (MFC) 250 is installed in a supply tube downstream from the argon supply source 254, and a second MFC 252 is installed in a supply tube downstream from the hydrogen supply source 256.

A first valve 261 is installed in the supply tube between the first MFC 250 and the argon source 254, and a second valve 262 is installed in the supply tube between the first MFC 250 and the pre-cleaning apparatus 200. In addition, a third valve 263 is installed in the supply tube between the second MFC 252 and the hydrogen source 256, and a forth valve 264 is installed in the supply tube between the second MFC 252 and the pre-cleaning apparatus 200.

Referring to FIGS. 7 to 9, after the substrate 100 having a contact hole is positioned on a quartz mask 275 (S10), pump 240 is operated to vacuumize the processing chamber 210 (S20). That is, the substrate 100 including an oxide film or remaining impurities is transferred into the processing chamber 210, and the substrate 100 is disposed in a processing space provided by the quartz mask 275 and the quartz belljar 270.

Once high vacuum is obtained in the processing chamber 210, an argon gas and a hydrogen gas are introduced into the processing chamber 210 through the first MFC 250 and the second MFC 252. The flow rates of the argon and hydrogen gases are controlled by the first MFC 250 and second MFC 252, respectively. The argon and hydrogen gases are mixed together to form a first mixing gas, and then the first mixing gas is introduced into the processing chamber 210 (S30).

In the present invention, the flow rate of the argon gas relative to the hydrogen gas is about 1:0.8 to about 1:1.2. According to a preferred embodiment of the present invention, the first mixture gas includes the argon gas at a flow rate of about 5 sccm (standard cubic centimeters per minute) and the hydrogen gas at a flow rate of about 5 sccm. Namely, the flow rate ratio between the argon gas and the hydrogen gas is about 1:1. However, the ratio and the flow rate of the argon gas and the hydrogen gas in the first mixture gas can be varied in accordance with the processing chamber 210, the semiconductor substrate 100, or the processing conditions.

The ICP device 220 and the bias device 230 activate the first mixture gas to form a plasma in the processing chamber 210, and then the plasma generated from the first mixture gas reacts with the oxide film and/or the impurities on the substrate 100 when a first RF etching process is executed (S40).

As shown in FIG. 9, chemical reactions of the oxide film, the impurities, the metal oxide film 122, and the hydrogen react during the first RF etching process.

The processing space in the processing chamber 210 is maintained at a temperature of about 450° C. to about 550° C. during the first RF etching process, thereby accelerating the above-mentioned chemical reactions.

As it is described above, the hydrogen reacts with silicon (Si) and silicon oxide ($SiO_x$) to form silane ($SiH_4$) and water ($H_2O$) so that the silicon and the silicon oxide can be removed from the substrate 100 as the phases of silane ($SiH_4$) and water ($H_2O$). Simultaneously, cobalt (Co) included in the metal silicide film 122 reacts with the hydrogen to form cobalt hydride ($CoH_x$) such that the cobalt hydride is deposited on the source and drain region 120 of the substrate 100. As a result, the cobalt may remain on the source and drain region 120 of the substrate 100. That is, according to the aforementioned equations 1, 2 and 3 such as $Si+4H^+ \rightarrow SiH_4 (\uparrow)$, $SiO_2+8H_2 \rightarrow SiH_4 (\uparrow)+2H_2O (\uparrow)$, and $Co+xH \rightarrow CoH_x (\downarrow)$, the first RF etching process removes the oxide film and the impurities from the substrate 100 using the plasma generated from the first mixture gas including the argon and the hydrogen gases.

When the first RF etching process is performed for the predetermined time, the operation of the ICP and the bias devices 220 and 230 are terminated, thereby completing the first RF etching process.

After the first RF etching process is complete, the first and the third valves 261 and 263 are closed, the pump 240 is operated to substantially or completely exhaust the first mixture gas from the processing chamber 210 and the first and the second MFC 250 and 252 (S50).

After the substrate 100 is removed from the processing chamber 210, the substrate 100 is transferred for successive processing (S60). Then, the pump 240 operates to create a vacuum in the processing chamber 210 (S70).

When the first MFC 250 operates and the first and the second valves 261 and 262 are open, a second gas including an argon gas is supplied into the processing chamber 210

(S80). Since the third valve 263 and the forth valve 264 are closed, the hydrogen gas cannot be supplied into the processing chamber 210.

After the second gas is introduced into the processing chamber 210, RF energy is applied to the second gas to generate a argon plasma, thereby starting a second RF etching process (S90).

During the first RF etching process, the hydrogen reacts with the silicon, the silicon oxide, and the cobalt. At the same time, a hydrogen radical collides with the quartz belljar 270 and the quartz mask 275. Thus, reaction by-products remain in the processing chamber 210 while other compounds are generated during the reactions of the hydrogen and the quartz (silicon oxide) in the quartz belljar 270 and the quartz mask 275. The compounds may remain on the quartz belljar 270 and/or on the quartz mask 275 when the first mixture gas is exhausted from the processing chamber 210 after the first RF etching process.

The remaining compounds of the hydrogen and the quartz may gradually accumulate in the processing chamber 210. The accumulated compounds become the particles that adhere to or deposit on a substrate after a predetermined number of substrates have been treated in the processing chamber 210. The particles can cause the failure of a semiconductor device formed on the substrate and decrease the throughput of the semiconductor substrates.

According to a pre-cleaning method of the present invention, a second gas without the hydrogen gas (namely, non-hydrogenous) is supplied to the processing chamber 210 after the substrate 100 is removed from the processing chamber 210. Then, the second RF etching process is performed with the plasma generated from the second gas. After the second RF etching process is completed, the pump 240 is operated to exhaust the gas from the processing chamber 210.

Figure 10:
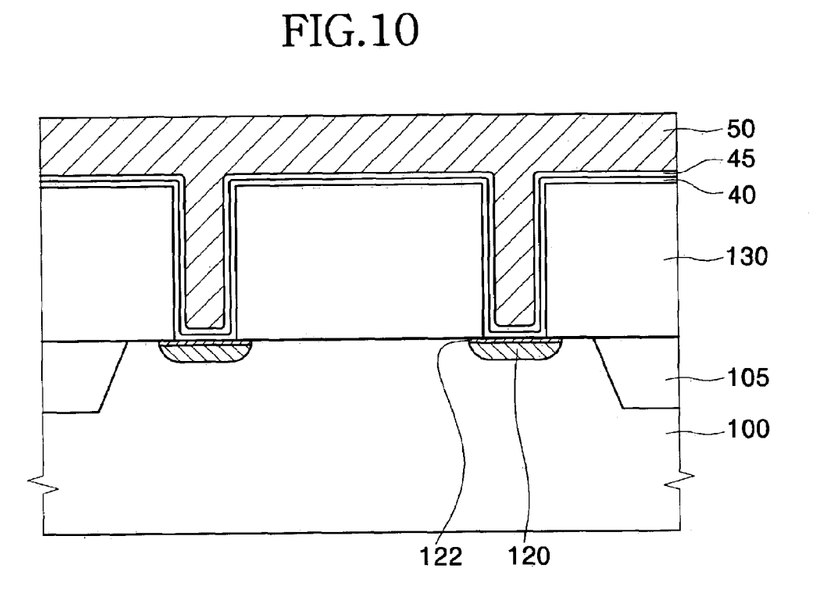
FIGS. 10 and 11 are cross-sectional views illustrating a method for manufacturing the semiconductor device according to another embodiment of the present invention.
Figure 11:
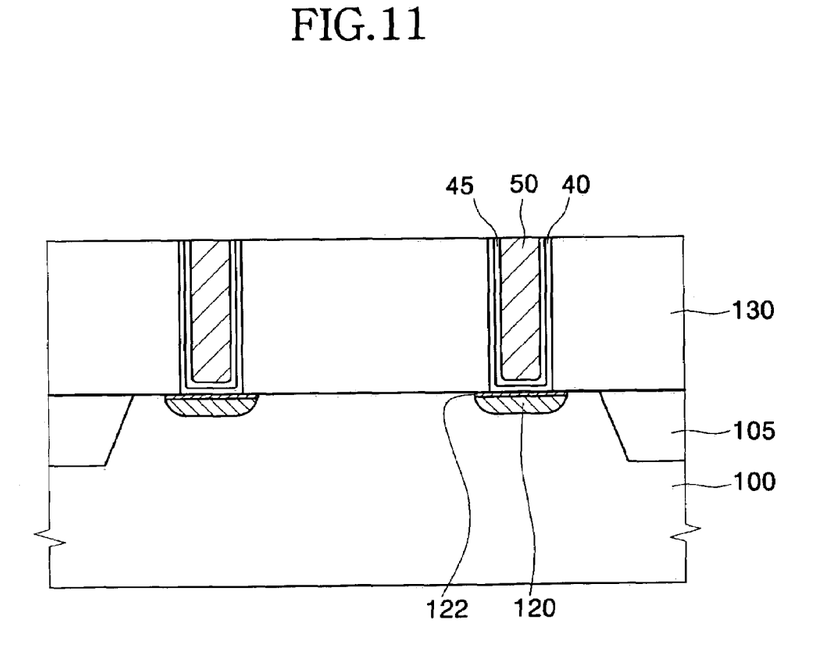

FIGS. 10 and 11 are cross-sectional views illustrating a method for manufacturing the semiconductor device according to another embodiment of the present invention.

The metal silicide film 122 of the substrate 100 is not damaged during the RF etching processes for removing the oxide film 134 and the impurities.

Referring to FIG. 10, after titanium and titanium nitride (TiN) are successively deposited on the source and drain region 120 and on the inside the contact hole, the combination of the titanium and the titanium nitride films serve as a metal barrier layer. Then, tungsten is deposited on the titanium and the titanium nitride films by a plasma enhanced CVD (PECVD) process, thereby forming a tungsten plug 50.

Referring to FIG. 11, after the titanium and the titanium nitride films, and the tungsten plug 50 are successively formed, they are polished through a chemical mechanical polishing (CMP) process or an etch back process so that the plug 50 is completed. Therefore, one of ordinary skill in the art can readily appreciate that the known processes for forming semiconductor devices like capacitors and transistors can be applied.

Figure 12A:
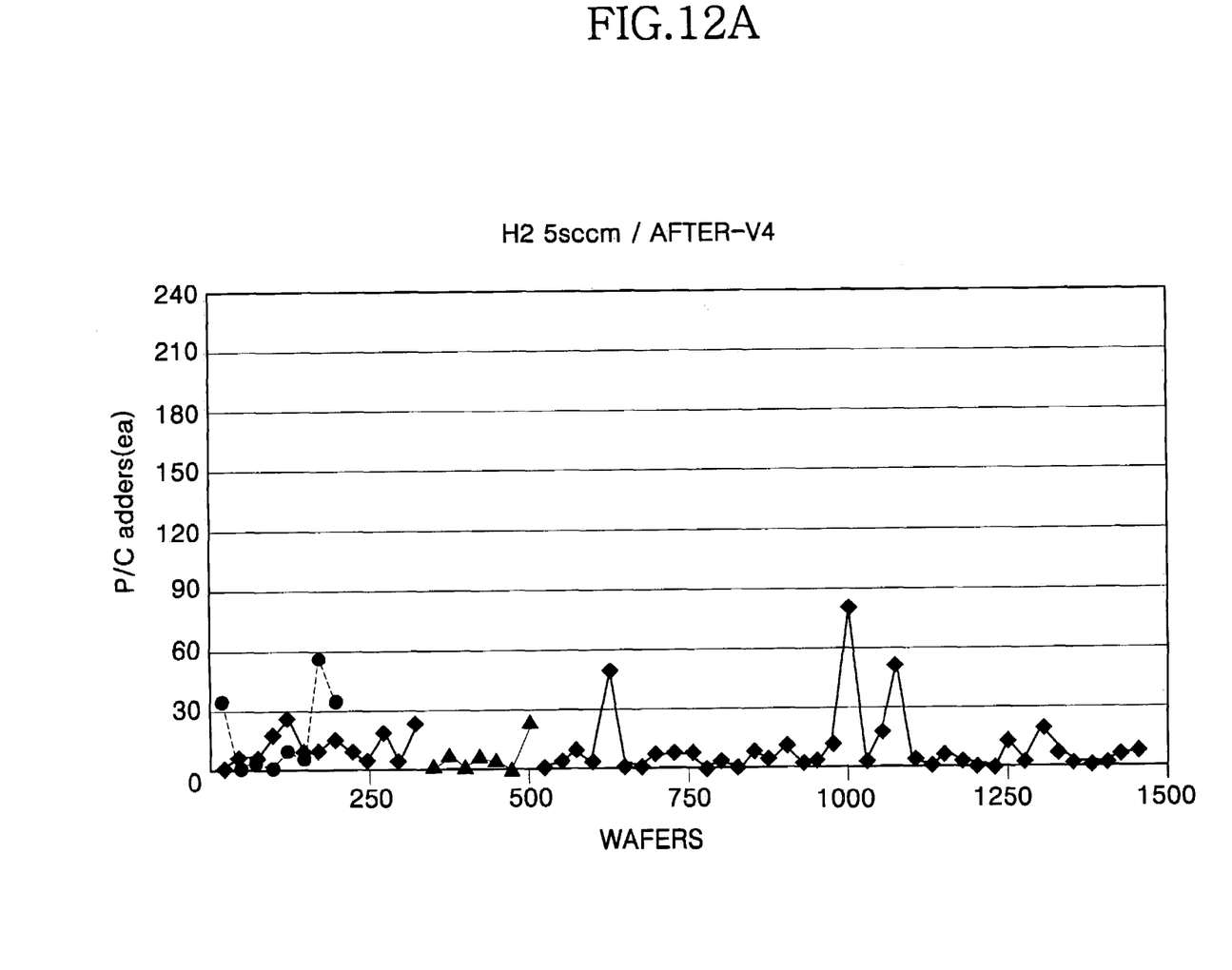
FIG. 12A is a graph illustrating the increase of particles (P/C adders) relative to the number of wafers according to embodiments of the present invention.
Figure 12B:
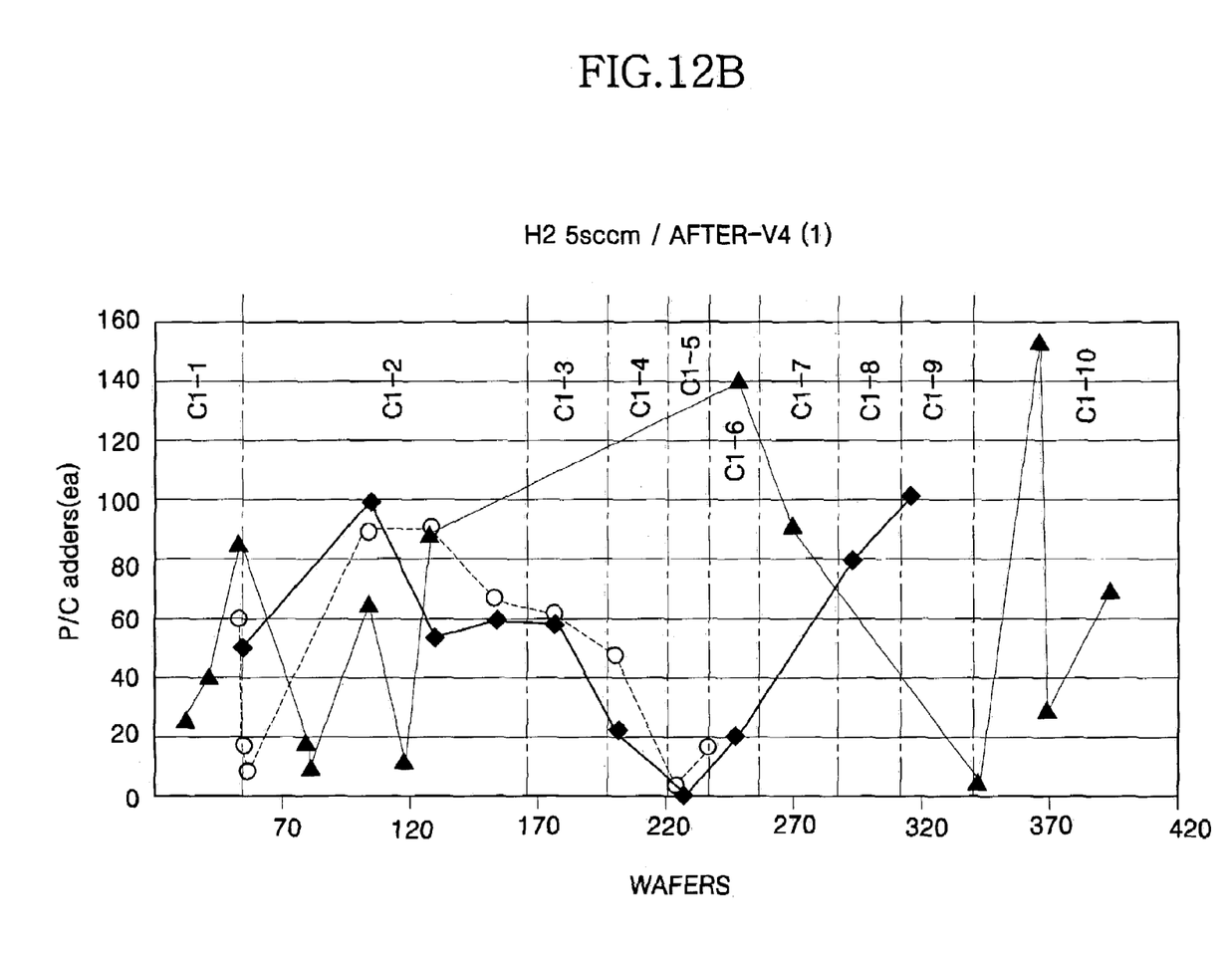
FIGS. 12B and 12C are graphs illustrating the augments of particles relative to the number of wafers according to the conventional method.
Figure 12C:
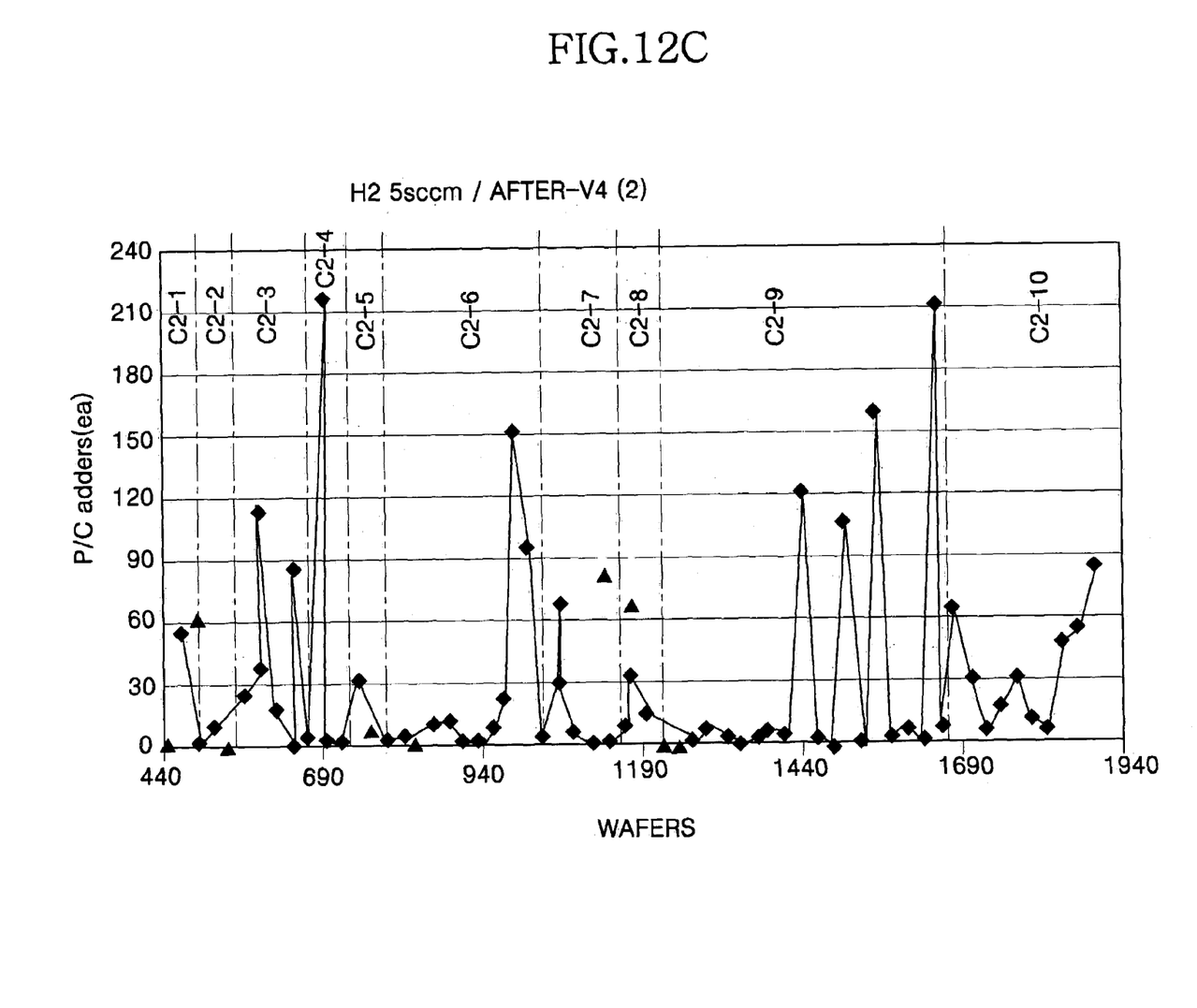

FIG. 12A is a graph illustrating the increase and reduction of particles (P/C adders) relative to the number of wafers process according to embodiments of the present invention, and FIGS. 12B and 12C are graphs illustrating the number of particles relative to the number of wafers processed according to the conventional method. In FIGS. 12B and 12C, the number of the particles are obtained in accordance with processing conditions varied in each step.

Referring to FIG. 12A, using the pre-cleaning processes according to the embodiments of the present invention, the quantity of P/C adders present in the chamber is about ten particles. In other words, the P/C adders according to the present are remarkably lower than that of the conventional method shown in FIGS. 12B and 12C.

In FIG. 12A, the increase of the particles are obtained through the second RF etching process after the first RF etching process is performed using the plasma generated from the first gas mixture of the argon and the hydrogen gases. At that time, the flow rates of the argon and the hydrogen gas are about 5 sccm in the first RF etching process. After the first RF etching process, the second RF etching process proceeds under the conditions that the electric power of the ICP device is about 500 W and the electric power of the bias device is about 50 W during the second RF etching process (the condition of AFTER-V4).

As shown in FIG. 12A, the P/C adders are considerably increased when the numbers of the wafers is about 620, about 1,000, and about 1,100. At those points, the particles are increased because the conventional process is executed concerning the related wafers to identify the effect of the present invention.

Referring to FIG. 12B, the augment of the particles can be obtained under the processing conditions as follows.

In the processing condition of C1-1, a first RF etching process is performed with a first mixture gas including an argon gas and a hydrogen gas, and then the remaining mixture gas in a processing chamber and a MFC is exhausted by pumping without performing a second RF etching process. During the first RF etching process with the first mixture gas, the processing chamber is maintained at a high temperature of about 500° C. so that the processing chamber is generally preheated (referred as a heat-up step) before the etching process.

In the processing condition of C1-2, the step of preheating the processing chamber is omitted to restrain particles from being generated from the hydrogen gas, and the mixture gas is exhausted from the processing chamber and the MFC by pumping, without performing a second RF etching process.

As for the processing condition of C1-3, the hydrogen gas is not used in the first RF etching process. However, because the radicals including hydrogen exist in a quartz belljar and a quartz mask, particles are generated on the wafer through the first RF etching process that is executed without the hydrogen gas.

According to the processing condition of C1-4, the first RF etching process is performed when the temperature is reduced from about 500° C. to about 200° C.

In the processing condition of C1-5, the first RF etching process is executed using the first mixture gas including the argon and the hydrogen gases while the second etching process is performed by employing the argon gas only in accordance with the conventional processing condition like argon-based etching process.

With the processing condition of C1-6, the first RF etching process is performed in accordance with the processing condition of C1-5 but the step of preheating the processing chamber is omitted according to the processing condition of C1-2.

As for the processing condition of C1-7, the first RF etching process is substantially performed in accordance with the processing condition of C1-5, however, the step of preheating the processing chamber is performed.

In the processing a condition of C1-8, the first RF etching process is performed using the plasma generated from the first mixture gas including the argon and the hydrogen gases. Then, the quartz mask including the wafer positioned thereon is etched with the plasma of the argon gas. During etching the quartz mask, the electric power of about 500 W is applied to the ICP device, and also the electric power of about 400 W is applied to the bias device (referred as AFTER-V3).

In the processing condition of C1-9, the first RF etching process and the quartz mask etching process are performed in accordance with the processing condition of C1-8 (AFTER-V3). However, the electric power is not applied to the bias device to minimize the damage of the quartz included in the quartz belljar and the quartz mask (referred as AFTER-V2).

As for the processing condition of C1-10, the first RF etching process is performed using the first mixture gas including the argon and the hydrogen gas in accordance with the conventional processing conditions using the argon gas only. However the second RF etching process is performed according to the processing condition of C1-8.

With the processing condition of C2-5, the second RF etching process is performed for about 40 seconds in accordance with the condition of C2-2.

In the processing condition of C2-6, the second RF etching process is performed for about 60 seconds in accordance with the condition of C2-2.

In the processing condition of C2-7, the electric power of 0 W is applied to the bias device during the second RF etching process in accordance with the condition of C2-6. That is, the electric power is not applied to the bias device.

According to the processing condition of C2-8, the second RF etching process is performed for about 100 seconds in accordance with the condition of C2-6.

As for the processing condition of C2-9, the pumping process concerning the processing chamber and the MFC are

TABLE 1

| No. | mark in drawings | detail condition | Ref. |
|---|---|---|---|
| C1-1 | Ar/H$_2$ STD | after Ar/H$_2$ plasma etching, pumping the chamber and the MFC | AFTER-V1 |
| C1-2 | Skip heat-up | before Ar/H$_2$ plasma etching, skipping a heat-up step | |
| C1-3 | w/o H2 | the first RF etching without H$_2$ | |
| C1-4 | 500° C. → 200° C. | the first RF etching performed at a temperature of about 200° C. | |
| C1-5 | Ar-base | employing the conventional processing condition using only H$_2$ | |
| C1-6 | Ar + skip heat-up | omitting the heat-up step under a condition of Ar Base | |
| C1-7 | Ar + heat-up | applying the heat-up step under the Ar-based condition | |
| C1-8 | quartz etch | after Ar/H$_2$ plasma etching, etching the quartz mask (ICP power of about 500 W, and bias power of about 400 W) | AFTER-V3 |
| C1-9 | not etching quartz | bias power under the condition of AFTER-V3 | AFTER-V2 |
| C1-10 | Ar + quartz etch | employing the condition of Ar-based and AFTER-V3 | |

Referring to Table 1 and FIG. 12B, the P/C adders are remarkably greater than that shown in FIG. 12A though the processing conditions are varied. Hence, the second RF etching process of the present invention can be advantageously performed for preventing the particles from forming on or adhering to the wafer.

Referring to FIG. 12C, FIG. 12C illustrates the number of the P/C adders present in the chamber in accordance with the following processing conditions.

In the processing condition of C2-1, the processes are performed in accordance with the condition of C1-1 (AFTER-V1).

According to the processing condition of C2-2, the electric power of approximately 50 W is applied to the bias device, and the second RF etching process is performed for approximately 20 seconds.

As for the processing condition of C2-3, the electric power of approximately 60 W is applied to the bias device in accordance with the condition of C2-2 to show that the P/C adders depend on the electric power applied to the bias device.

In the processing condition of C2-4, the electric power of approximately 70 W is applied to the bias device according to the condition of C2-2 to show that the P/C adders depend on the electric power applied to the bias device.

performed for about 120 seconds in accordance with the condition of C2-2 (AFTER-V4).

In the processing condition of C2-10, the first RF etching process is performed at a temperature of about 200° C. in accordance with the condition of C2-2 (AFTER-V4).

TABLE 2

| No. | mark in drawings | detail condition | Ref. |
|---|---|---|---|
| C2-1 | AFTER-V1 | AFTER-V1 | |
| C2-2 | AFTER-V4 B50W, T = 20 | bias power is about 50 W under the condition identical to AFTER-V3 (AFTER-V4) and etching time is about 20 seconds | |
| C2-3 | V4, B60W, T = 20 | bias power is about 60 W under the condition identical to AFTER-V4 | |
| C2-4 | V4, B70W, T = 20 | bias power is about 70 W under the condition identical to AFTER-V4 | |
| C2-5 | V4, B50W, T = 40 | etching time is about 40 seconds under the condition identical to AFTER-V4 | |
| C2-6 | V4, B60W, T = 60 | etching time is about 60 seconds under a condition as same as AFTER-V4 (AFTER-V5) | |
| C2-7 | V4, B0W, T = 60 | bias power is about 0 W under the condition identical to AFTER-V5 | |

TABLE 2-continued

| No. | mark in drawings | detail condition | Ref. |
|---|---|---|---|
| C2-8 | V4, B50W, T = 100 | etching time is about 100 seconds under the condition identical to AFTER-V5 | 5 |
| C2-9 | V4, B50W, T = 60, vac = 120 | pumping time is about 100 seconds under the condition identical to AFTER-V4 | |
| C2-10 | V4, B50W, T = 60 Temp = 200° C. | temperature is about 200° C. under the condition identical to AFTER-V4 | 10 |

Referring to Table 2 and FIG. 12C, the P/C adders are remarkably higher than that shown in FIG. 12A even though the processing conditions are varied. Thus, the second RF etching process of the present disclosure is very effective in preventing the formation and adherence of particles on a substrate.

According to the present invention, the first RF etching process using the first mixture gas including the hydrogen gas can improve the etching selectivity between the metal silicide and the oxide films. Thus, the damage of the source and drain region can be minimized, and the pre-cleaning process can be effectively performed.

Also, the second RF etching process can be performed without the hydrogen gas to prevent the formation and/or deposit of particles on a substrate.

Although exemplary preferred embodiments of the present disclosure have been described, it is to be understood that the present disclosure should not be limited to these preferred embodiments, but that various changes and modifications can be made by one skilled in the art while remaining within the spirit and scope of the present disclosure as hereinafter claimed.

What is claimed is:

1. A method for cleaning a processing chamber comprising:
   removing impurities on a semiconductor substrate in the processing chamber with a plasma of a first gas including a hydrogen gas;
   removing the semiconductor substrate from the processing chamber; and
   etching the processing chamber with a plasma of a non-hydrogenous second gas consisting of argon.

2. The method of claim 1, wherein silicon oxide is removed from the semiconductor substrate in the processing chamber.

3. The method of claim 1, wherein the first gas includes the second gas.

4. The method of claim 3, wherein a flow rate ratio between the argon gas and the hydrogen gas in the first gas is about 1:0.8 to about 1:1.2.

5. The method of claim 1, wherein the impurities on the semiconductor substrate are removed at a temperature of about 450° C. to about 550° C.

6. A method for cleaning a processing chamber comprising:
   positioning a semiconductor substrate on a stage in the processing chamber;
   vacuumizing the processing chamber;
   introducing a first gas into the processing chamber wherein the first gas includes an argon gas and a hydrogen gas;
   removing impurities on the semiconductor substrate with a plasma of the first gas;
   exhausting a gas from the processing chamber;
   removing the semiconductor substrate from the processing chamber;
   creating a vacuum in the processing chamber;
   introducing a non-hydrogenous second gas consisting of argon into the processing chamber; and
   etching the processing chamber with a plasma of the second gas consisting of argon.

7. The method of claim 6, further comprising a belljar is disposed over the stage, and a processing space provided by the belljar and the stage for positioning the semiconductor substrate.

8. The method of claim 7, wherein at least one of the stage and the belljar is comprised of silicon oxide.

9. The method of claim 6, wherein the impurities on the semiconductor substrate are removed at a temperature of about 450° C. to about 550° C.

10. The method of claim 6, wherein the first gas includes the second gas and wherein a flow rate ratio between the argon gas and the hydrogen gas in the first gas is about 1:0.8 to about 1:1.2.

11. The method of claim 6, further comprising exhausting the second gas from the processing chamber after the etching of the processing chamber with the plasma of the second gas is completed.

12. The method of claim 6, wherein exhausting the gas from the processing chamber includes exhausting the first gas and other compounds generated during the removing of impurities on the semiconductor substrate that have been prevented from depositing on the processing chamber or the substrate.

13. A method for manufacturing a semiconductor device comprising:
   positioning a semiconductor substrate in a processing chamber;
   removing impurities on the semiconductor substrate in the processing chamber with a plasma of a first gas including a hydrogen gas;
   removing the semiconductor substrate from the processing chamber; and
   etching the processing chamber with a plasma of a non-hydrogenous second gas consisting of argon.

14. The method of claim 13, wherein the first gas includes the second gas and the hydrogen gas.

15. The method of claim 14, wherein a flow rate ratio between the argon gas and the hydrogen gas in the first gas is about 1:0.8 to about 1:1.2.

16. The method of claim 15, wherein the impurities on the semiconductor substrate are removed at a temperature of about 450° C. to about 550° C.

* * * * *